United States Patent [19]

Kabadi et al.

[11] Patent Number: 4,798,918
[45] Date of Patent: Jan. 17, 1989

[54] HIGH DENSITY FLEXIBLE CIRCUIT

[75] Inventors: Ashok N. Kabadi, Beaverton; Leonard O. Turner; Michael T. White, both of Hillsboro, all of Oreg.

[73] Assignee: Intel Corporation, Santa Clara, Calif.

[21] Appl. No.: 99,259

[22] Filed: Sep. 21, 1987

[51] Int. Cl.⁴ .............................................. H01B 7/08
[52] U.S. Cl. ....................................... 174/36; 174/32; 174/117 FF; 333/1
[58] Field of Search .................... 174/32, 36, 117 F, ; 333/117 FF

[56] References Cited

U.S. PATENT DOCUMENTS

| | | | |
|---|---|---|---|
| 3,703,604 | 11/1972 | Henschen et al. | 174/36 X |
| 3,764,727 | 10/1973 | Balde | 174/117 FF X |
| 4,075,420 | 2/1978 | Walton | 174/117 FF X |
| 4,381,420 | 4/1983 | Elliott et al. | 174/117 FF X |
| 4,490,690 | 12/1984 | Suzuki | 174/117 FF X |
| 4,680,557 | 7/1987 | Crompton | 174/36 X |
| 4,707,671 | 11/1987 | Suzuki et al. | 174/117 FF X |

Primary Examiner—Morris H. Nimmo
Attorney, Agent, or Firm—Blakely, Sokoloff, Taylor & Zafman

[57] ABSTRACT

A high density flexible circuit for coupling electrical devices. The flexible circuit has signal and ground traces on both sides of the flexible circuit. Each signal trace is surrounded by ground traces. There is a ground trace on either side of each signal trace and two ground traces located below each signal trace. This system of placing ground traces surrounding each signal trace reduces electrical noise between the signal traces and reduces the electrical capacitance of the circuit.

15 Claims, 2 Drawing Sheets

FIG_1A
(PRIOR ART)
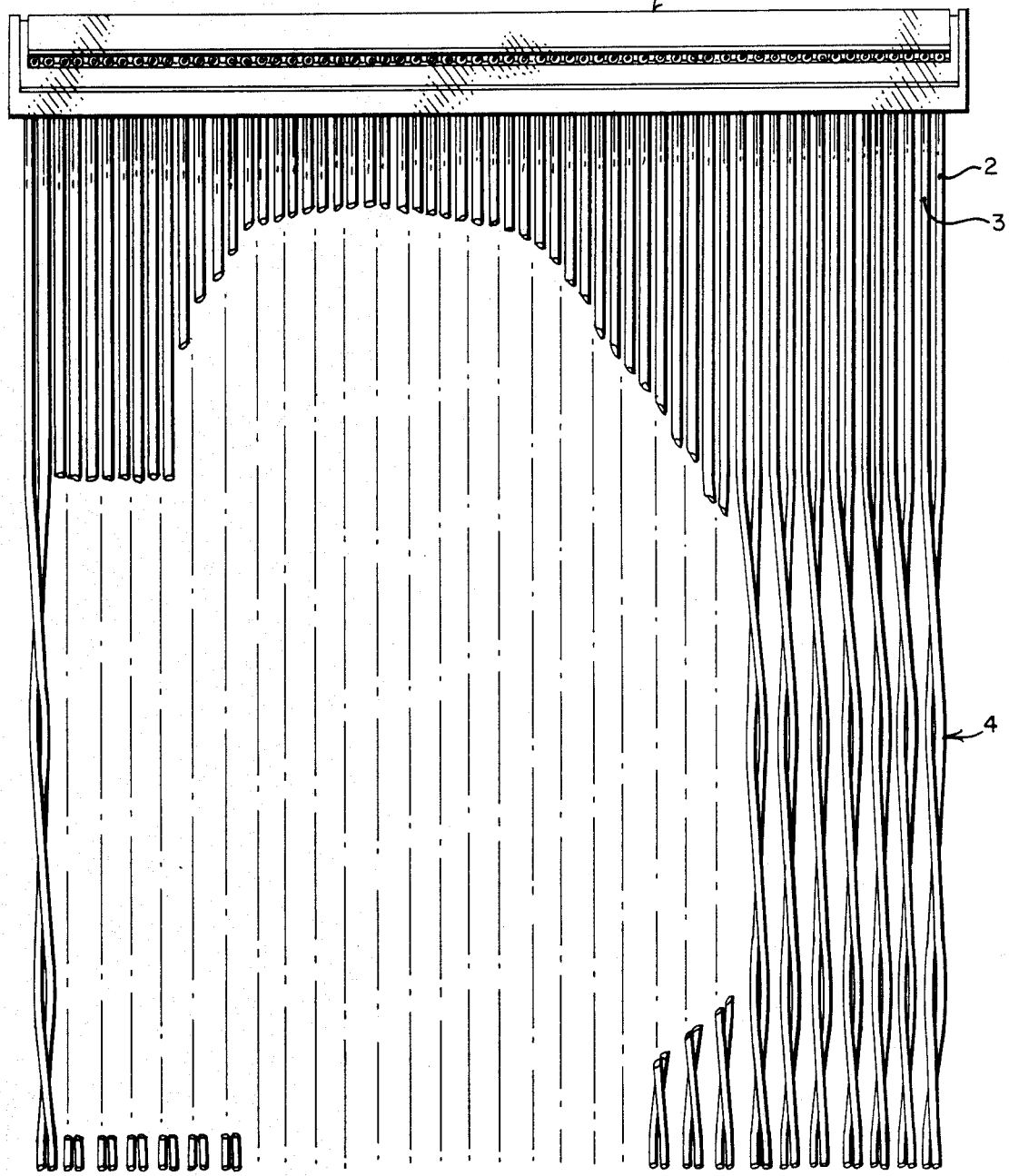
FIG_1B
(PRIOR ART)
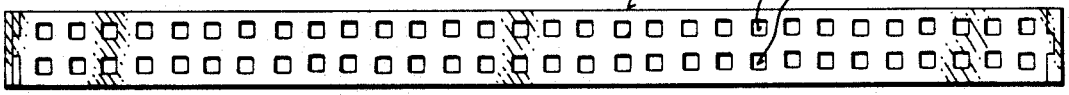

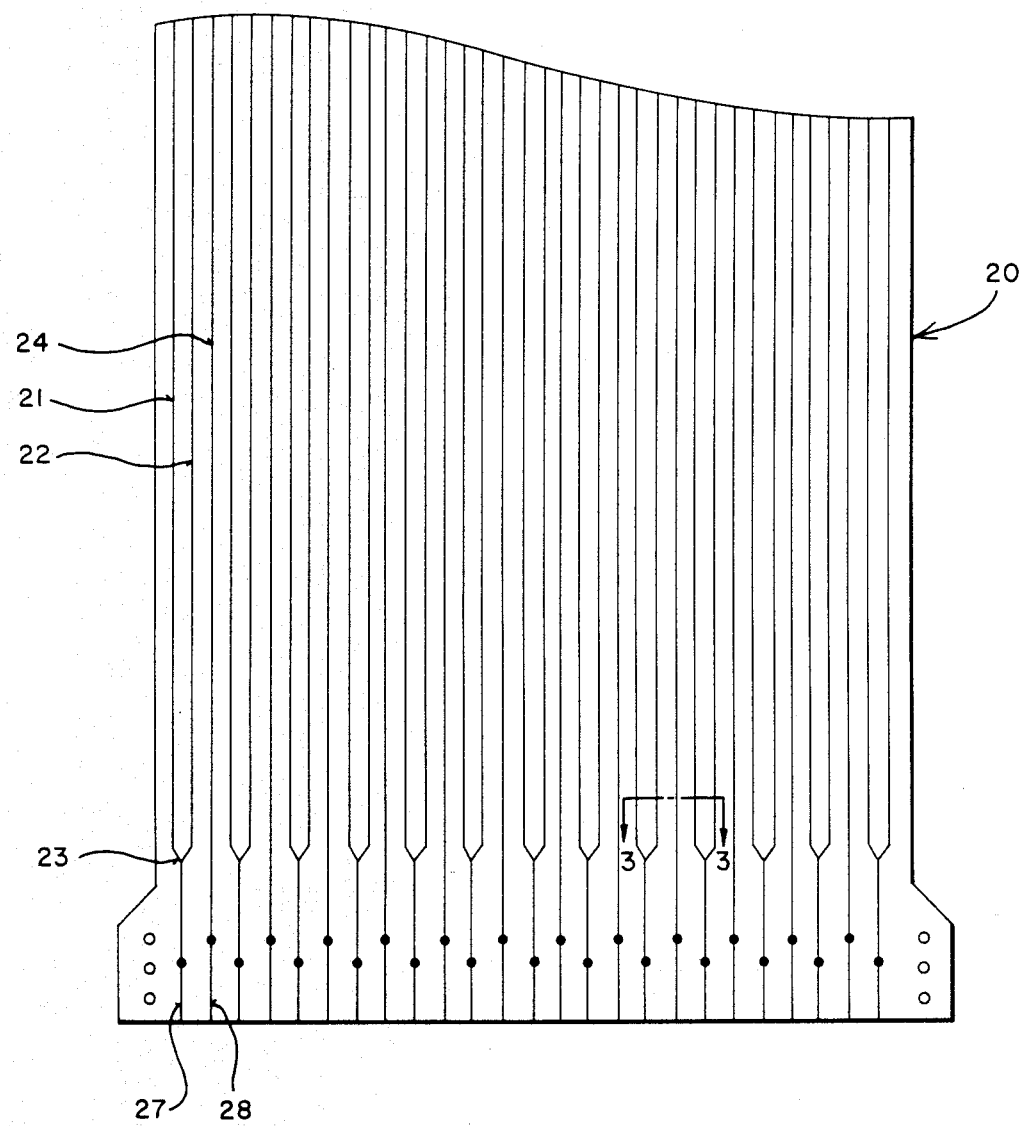
FIG_2
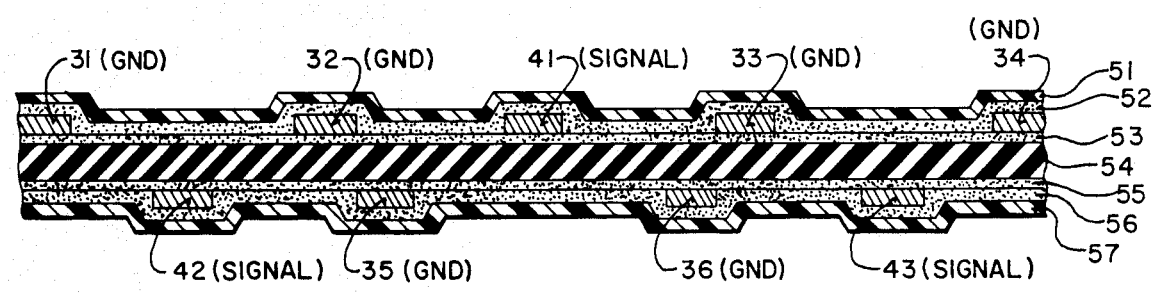
FIG_3

HIGH DENSITY FLEXIBLE CIRCUIT

BACKGROUND OF THE INVENTION

1. Field of the Invention

This invention relates to the field of electrical cables, and particularly to the field of high density electrical cabling systems.

2. Prior Art

As computer systems become smaller it is advantageous to develop cables for carrying signals which allow for a greater number of signal wires in a given amount of space. At the same time, of the requirements such as low noise and cross-talk between signal wires, high speed, flexibility and aesthetics are important.

One method of providing signal wires between components in the computer system consists of the use of twist and flat cable. Twist and flat cable has a single layer of construction with alternating signal and ground traces. Twist and flat cable will be more fully described in connection with FIG. 1(a) and FIG. 1(b). It is desired to develop a cable which will reduce the level of noise and cross-talk between adjacent signal leads from that of twist and flat cable and which will increase the density of signal leads on the cable.

SUMMARY OF THE INVENTION

An improved electrical circuit is desribed for use in connecting and transmitting electrical signals between devices. The invention consists of a flexible circuit with signal and ground traces on both sides of the circuit. The signal and ground traces are placed on the circuit in a manner which minimizes cross-talk between adjacent signals and also minimizes capacitance of the cable. Each signal trace has a ground trace on either side of it and has ground traces below it. This arrangement of signal and ground traces minimizes the cross-talk between adjacent signal circuits and also allows for a greater density of signal and ground trace circuits on the cable.

In one embodiment of the present invention a double-sided Kapton TM polyimide strip is used with signal and ground traces etched on both sides. A layer of Teflon TM coating with acrylic adhesive is used as a cover sheet.

BRIEF DESCRIPTION OF THE DRAWINGS

FIG. 1(a) illustrates a prior art twist and flat cable.

FIG. 1(b) illustrates a prior art connector which may be utilized with the twist and flat cable.

FIG. 2 illustrates a top perspective view of a flexible circuit cable as disclosed by the present invention.

FIG. 3 illustrates a cross sectional view of a flexible circuit as disclosed by the present invention.

DETAILED DESCRIPTION OF THE PRESENT INVENTION

A flexible circuit for connecting electrical devices and transmitting signals between such devices is disclosed. In the following description, numerous specific details are set forth such as specific types of material, etc., in order to provide a thorough understanding of the present invention. It will be obvious, however, to one skilled in the art that the present invention may be practiced without these specific details. In other instances, well known techniques and structures have not been shown in detail in order not to unnecessarily obscure the present invention.

PRIOR ART CABLE

FIG. 1(a) illustrates a twist and flat cable which is well known in the art. The twist and flat cable consists of a plurality of pairs of ground and signal wires. As illustrated, a ground wire 2 and a signal wire 3 are not twisted as they near the connector 1. A short distance from the connector 1 the ground wire 2 and the signal wire 3 are twisted as shown in area 4. The purpose in twisting the ground wire and the signal wire is to reduced noise and cross talk between signal wires. However, significant noise and cross talk remain.

A typical twist and flat cable has leads located on 0.050 inch centers. Since each signal wire requires one ground wire this yields an effective density of signal wires being located on 0.100 inch centers.

FIGS. 1(b) is illustrative of a typical connector 1 utilized with twist and flat cable. In the connector, each ground wire may terminate into a ground socket 7, the ground sockets being located along the bottom of the connector. Each signal wire may terminate into a signal socket 8, the signal sockets being located across the top of the connector.

It is desirable to develop a connection apparatus which offers greater signal circuit density and improved electrical characteristics.

DESCRIPTION OF THE PREFERRED EMBODIMENT

FIG. 2 illustrates a flexible circuit as may be utilized by the present invention. The flexible circuit has a plurality of ground traces such as trace 21 and 22. In the preferred embodiment, the ground traces are located on the circuit in pairs and forked into a single termination point 27. Interspersed within the pairs of ground traces are signal traces, such as trace 24. The signal traces terminate at the end of the cable at point 28. As will be seen in connection with FIG. 3, the ground traces and signal traces are located on both the top and bottom of the flexible circuit.

The flexible circuit may be connected to a computer system, printed circuit board or other device through use of a connector. One such connector is described in the Applicant's co-pending application Ser. No. 053,270, filed on May 21, 1987 entitled High Density Flexible Circuit Connector.

FIG. 3 illustrates a cross sectional view of the flexible circuit utilized by the preferred embodiment of the present invention. The flexible circuit comprises a 0.003 inch thick Kapton TM polyimide strip 54 with signal traces 41–43 and ground traces 31–36 etched on both sides. The signal traces 41–43 and ground traces 31–36 are comprised of rolled annealled copper approximately 0.0014 inches thick and 0.005 inches wide.

An acrylic adhesive 53 and 55 is used between the Kapton TM strip and the copper traces 31–36 and 41–43. The layer of acrylic adhesive 53 and 55 is approximately 0.001 inch.

A layer of Teflon TM coating or Kapton TM coating 51 and 57, approximately 0.001 inches thick, is used as a cover sheet. A layer of acrylic adhesive 52 and 56 is used to attach the cover sheet 51 and 57 to the flexible circuit. The acrylic adhesive 52 and 56 is approximately 0.001 inch thick.

It will be obvious to one of ordinary skill in the art that alternative types of materials may be utilized without departing from the spirit of the present invention. In addition, alternative dimensions for materials may be utilized. For example, a Teflon ™ material may be utilized in place of the Kapton ™ strip 54 and/or the Kapton ™ coating layers 51 and 57.

In order to minimize noise and cross talk on the flexible circuit, signal circuits are placed such that they are surrounded by ground traces. For example, signal trace 41 is surrounded on two sides by ground trace 32 and ground trace 33. Signal trace 41 is further surrounded from the bottom by ground trace 35 and ground trace 36. Similarly, signal trace 43 is surrounded on one side by ground trace 36 and on the other side by another ground trace (not shown). Signal trace 43 is further surrounded on the top by ground trace 33 and ground trace 34. Signal traces are terminated at both ends of the cable into pads 0.012 inches wide by 0.140 inches long. Each pair of ground traces such as ground trace 31 and 32 are terminated in a fork as illustrated in FIG. 2 on both ends of the cable. The forks are then terminated into pads 0.012 inches wide by 0.140 inches long. All pads are located on 0.025 inch centers. This means that the preferred embodiment of the present invention allows signal traces on the cable to be located at an effective density of 0.050 inch centers. This yields approximately twice the density of the twist and flat cable. In addition to the increased density of signal traces, the present invention discloses a cable which is subject to less noise and cross talk than twist and flat cable because of surrounding signal traces on all sides with ground traces.

Thus, an improved cable for connecting electrical devices and allowing transmission of signals between such devices is disclosed. The cable utilizes ground traces surrounding the signal traces in order to yield improved electrical characteristics. This also allows for increased density of the signal traces on the cable.

We claim:

1. A circuit for coupling devices, comprising:
   a strip of base material;
   a first signal trace mounted on the top surface of said base material for carrying electrical signals, said first signal trace having a cross-sectional dimension D;
   a first ground trace mounted on the top surface of said base material located on a first side of said first signal trace, said first ground trace having a cross-sectional dimension D;
   a second ground trace mounted on the top surface of said base material located on a second side of said first signal trace, said second ground trace having a cross-sectional dimensional D;
   a third ground trace mounted on the bottom surface of said base material located beneath said first signal trace, said third ground trace having a cross-sectional dimension D;
   a fourth ground trace mounted on the bottom surface of said base material located adjacent to said third ground trace, said fourth ground trace having a cross-sectional dimension D.

2. The circuit, as recited in claim 1, further comprising a top first adhesive layer bonded to said top surface of said material such that said first signal trace and said first and second ground traces are bonded to said top first adhesive layer and a bottom first adhesive layer bonded to said bottom surface of said base material such that said third and fourth ground traces are bonded to said bottom first adhesive layer.

3. The circuit, as recited in claim 2, further comprising a top second adhesive layer bonded to said top first adhesive layer, such that said first signal trace and said first and second ground traces are positioned between said top first adhesive layer and said top second adhesive layer and a bottom second adhesive layer bonded to said bottom first adhesive layer, such that said third and fourth ground traces are positioned between said bottom first adhesive layer and said bottom second adhesive layer.

4. The circuit, as recited in claim 3, further comprising a top protective covering bonded to said top second adhesive layer and a bottom protective covering bonded to said bottom second adhesive layer.

5. The circuit, as recited in claim 4, wherein said signal traces are comprised of copper strips.

6. The circuit, as recited in claim 5, wherein said first, second, third and fourth ground traces are comprised of copper.

7. The circuit, as recited in claim 6, further comprising a second signal trace bonded on said bottom first adhesive layer located adjacent to said third ground trace such that said fourth ground trace is on the other side of said third ground trace and a fifth ground trace bonded to said top first adhesive layer located adjacent to said first ground trace such that said first signal trace is on the other side of said first ground trace.

8. The circuit, as recited in claim 7, wherein said third and fourth ground traces are joined together at both ends of said circuit and terminate at a single termination point.

9. The circuit, as recited in claim 1, wherein cross-sectional dimension of said first signal trace, said first, second, third and fourth ground traces are approximately 0.0014" thick and approximately 0.005" wide.

10. A flexible circuit for coupling electrical devices, comprising:
    a strip of base material;
    a plurality of signal traces mounted on both the top side and the bottom side of said base material for carrying electrical signals;
    a plurality of ground traces mounted on both the top side and the bottom side of said base material for reducing electrical noise between said plurality of signal traces;
    an arrangement of said signal traces such that a single signal trace is surrounded by four ground traces, two of said ground traces on the same side of said base material as said single signal trace and two of said ground traces on the opposite side of said base material from said single signal trace;
    whereby, a circuit for coupling electrical devices is constructed.

11. The circuit, as recited in claim 10, further comprising a first adhesive layer mounted on top of said base material and said plurality of signal traces and said plurality of ground traces mounted to top of said first adhesive layer and another first adhesive layer mounted on bottom of said base material and said plurality of signal traces and said plurality of ground traces mounted to bottom of said other first adhesive layer.

12. The circuit, as recited in claim 11, further comprising:
    a first set of arranged layers comprising a second adhesive layer mounted on top of said first adhesive layer and said plurality of signal traces and said plurality of ground traces positioned between said first adhesive layer and said second adhesive layer such that the bottom surface of said first adhesive layer of said first set of arranged layers is bonded to the top surface of said base material.

13. The circuit, as recited in claim 12, further comprising a layer of protective coating bonded to the top surface of the top and bottom second adhesive layer on both sides of said flexible circuit.

14. The circuit, as recited in claim 13, wherein said plurality of ground traces are grouped in pairs.

15. The circuit, as recited in claim 14, wherein said pairs of ground traces are joined together at each end of flexible circuit and terminate in a common termination point.

* * * * *